(12) United States Patent
Benware

(10) Patent No.: US 6,954,705 B2
(45) Date of Patent: Oct. 11, 2005

(54) METHOD OF SCREENING DEFECTS USING LOW VOLTAGE IDDQ MEASUREMENT

(75) Inventor: Robert Benware, Fort Collins, CO (US)

(73) Assignee: LSI Logic Corporation, Milpitas, CA (US)

(*) Notice: Subject to any disclaimer, the term of this patent is extended or adjusted under 35 U.S.C. 154(b) by 189 days.

(21) Appl. No.: 10/602,357

(22) Filed: Jun. 23, 2003

(65) Prior Publication Data

US 2004/0260494 A1 Dec. 23, 2004

(51) Int. Cl.⁷ .............................................. G06F 19/00
(52) U.S. Cl. ..................................... 702/64; 324/76.69
(58) Field of Search ............................... 702/64, 65–67, 702/73, 189, 193; 324/500, 522, 76.11, 76.69

(56) References Cited

U.S. PATENT DOCUMENTS 5,057,774 A * 10/1991 Verhelst et al. ............. 324/537
6,031,386 A *  2/2000 Cole et al. .................. 324/765

* cited by examiner

Primary Examiner—Edward Raymond
(74) Attorney, Agent, or Firm—Fitch, Even, Tabin & Flannery

(57) ABSTRACT

A method of screening defects includes steps of: (a) measuring a quiescent current at a first supply voltage for each of a plurality of devices; (b) measuring a quiescent current at a second supply voltage for each of the plurality of devices; (c) generating a plot of the quiescent current measured at the first supply voltage vs. the quiescent current measured at the second supply voltage for each of the plurality of devices; (d) determining a range of intrinsic variation of quiescent current in the plot; and (e) identifying any of the plurality of devices corresponding to a measurement plotted outside the range of intrinsic variation as defective.

16 Claims, 2 Drawing Sheets

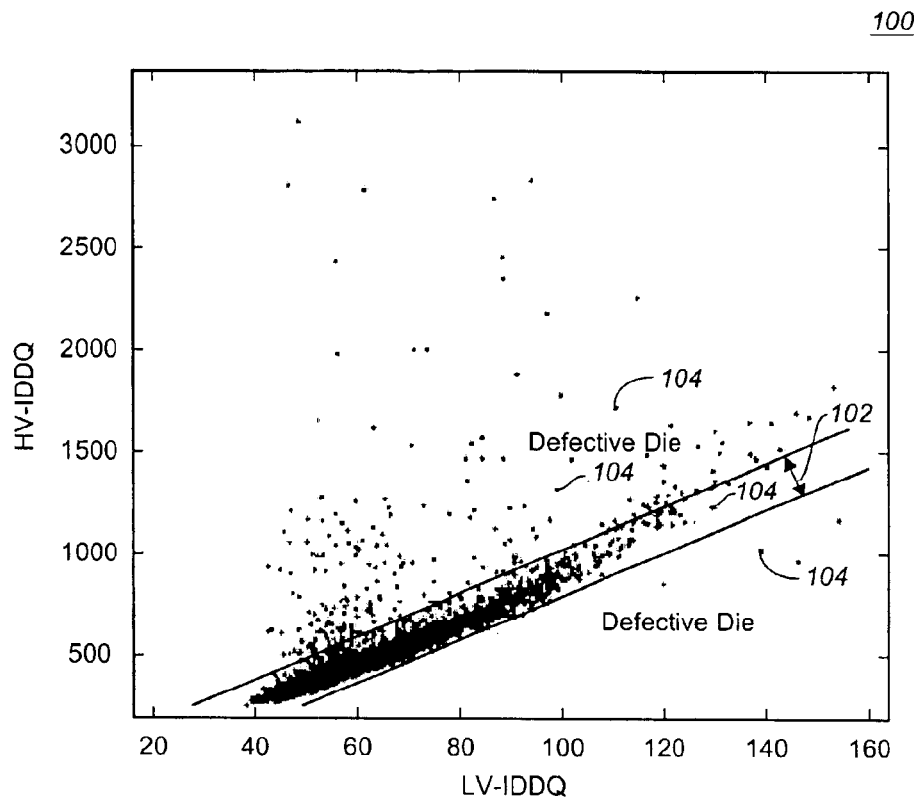
FIG._1
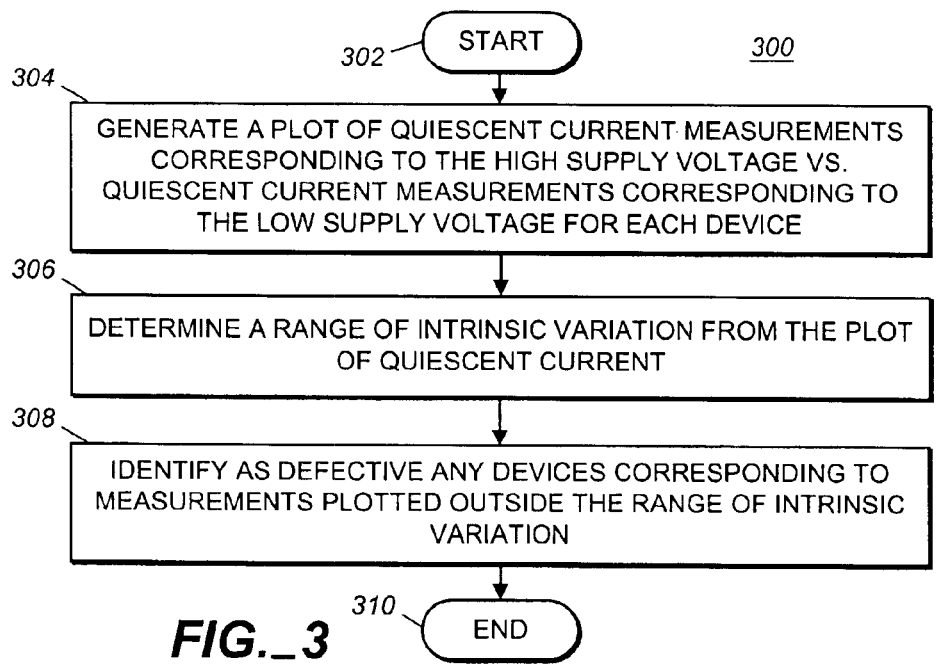
FIG._3

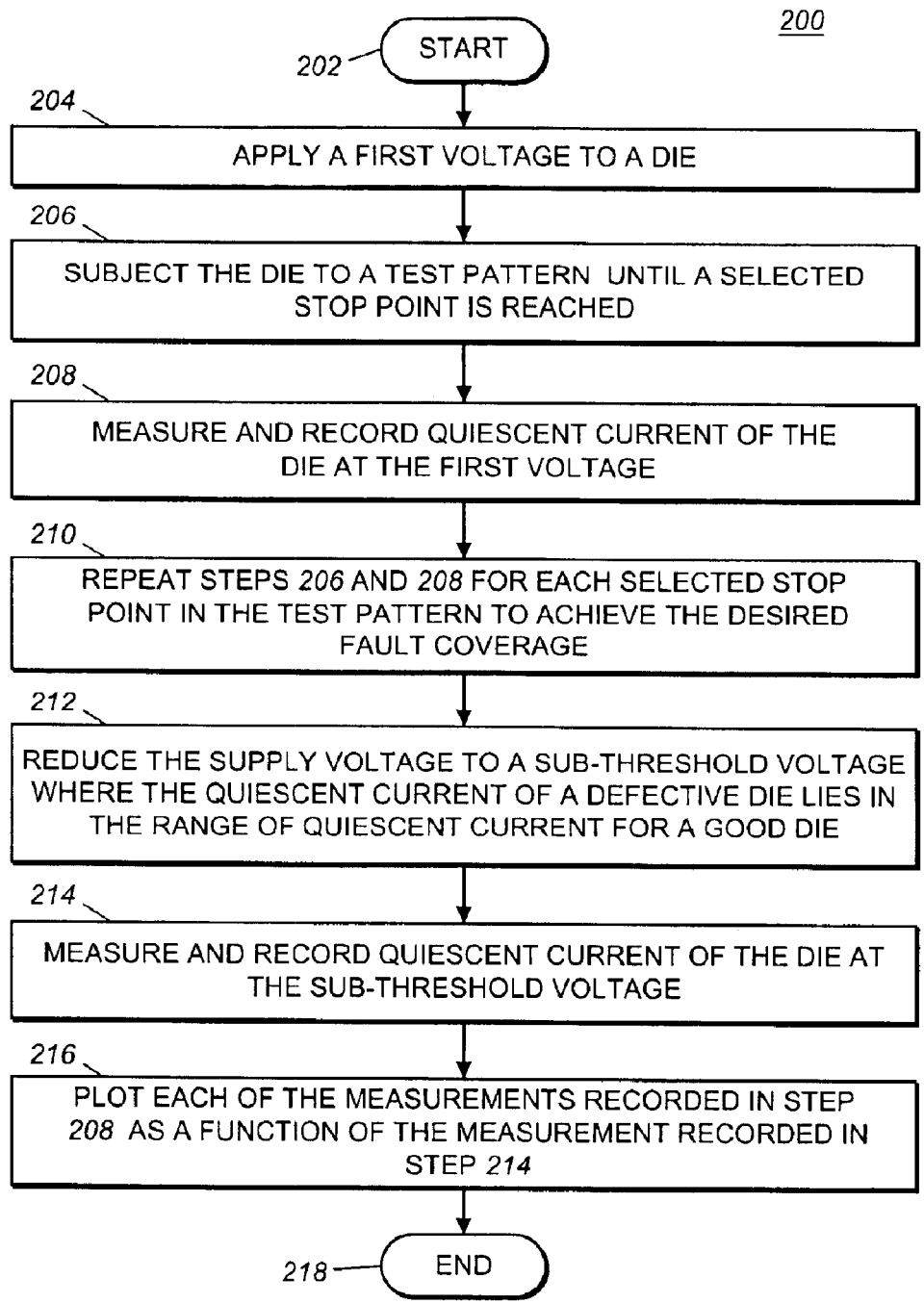
FIG._2

METHOD OF SCREENING DEFECTS USING LOW VOLTAGE IDDQ MEASUREMENT

BACKGROUND OF THE INVENTION

1. Field of the Invention

The present invention is directed to testing and screening of integrated circuit die to detect defective devices. More specifically, but without limitation thereto, the present invention is directed to a method of screening defective die by reducing variance in measured quiescent current due to process variations.

2. Description of Related Art

Quiescent current testing has proven to be an effective approach to screening defects during manufacturing and testing of semiconductor devices. As semiconductor technology progresses toward reduced transistor size, single limit quiescent current (IDDQ) testing becomes less effective due to large variances in quiescent current resulting from process shifts during manufacturing. The large variances in quiescent current are likely to result in screening good die as defective or in passing defective die.

SUMMARY OF THE INVENTION

In one aspect of the present invention, a method of screening defects includes steps of: (a) measuring a quiescent current at a first supply voltage for each of a plurality of devices; (b) measuring a quiescent current at a second supply voltage for each of the plurality of devices; (c) generating a plot of the quiescent current measured at the first supply voltage vs. the quiescent current measured at the second supply voltage for each of the plurality of devices; (d) determining a range of intrinsic variation of quiescent current in the plot; and (e) identifying any of the plurality of devices corresponding to a measurement plotted outside the range of intrinsic variation as defective.

In another aspect of the present invention, a computer program product for screening defects includes a medium for embodying a computer program for input to a computer and a computer program embodied in the medium for causing the computer to perform steps of: (a) measuring a quiescent current at a first supply voltage for each of a plurality of devices; (b) measuring a quiescent current at a second supply voltage for each of the plurality of devices; (c) generating a plot of the quiescent current measured at the first supply voltage vs. the quiescent current measured at the second supply voltage for each of the plurality of devices; (d) determining a range of intrinsic variation of quiescent current in the plot; and (e) identifying any of the plurality of devices corresponding to a measurement plotted outside the range of intrinsic variation as defective.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a scatter plot of quiescent current measurements for die in a wafer lot according to an embodiment of the present invention;

FIG. 2 illustrates a flow chart of a method of plotting quiescent current for screening defects according to an embodiment of the present invention; and FIG. 3 illustrates a flow chart 300 of a method of screening defects according to an embodiment of the present invention.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

In previous methods of reducing the variance of quiescent current due to process shifts, the quiescent current corresponding to the speed performance of a semiconductor device (device delay vs. IDDQ) or the quiescent current for different logic states of the semiconductor device (delta IDDQ) is used to predict the quiescent current limit for a defect free device.

A disadvantage of the device delay vs. IDDQ approach is that the "on" characteristics, such as operating speed, are becoming less indicative of the value of quiescent current in the "off" state of the semiconductor device. As a result, the "on" characteristics are becoming less effective as a tool for predicting quiescent current.

A disadvantage of the delta IDDQ approach is that although the quiescent current measured in one "off" state may successfully predict the quiescent current of another "off" state (differential mode), a defect that draws excessive quiescent current in all measured "off" states (common mode) may not be detected. Common mode defects also occur more frequently than differential mode defects.

The present invention provides a method of screening defective die that advantageously screens not only defects predicted by both the device delay vs. IDDQ and delta IDDQ approaches, but also screens other defects as well.

In one aspect of the present invention, a method of screening defective devices includes steps of: (a) measuring a quiescent current at a first supply voltage for each of a plurality of devices; (b) measuring a quiescent current at a second supply voltage for each of the plurality of devices; (c) generating a plot of the quiescent current measured at the first supply voltage vs. the quiescent current measured at the second supply voltage for each of the plurality of devices; (d) determining a range of intrinsic variation of quiescent current in the plot; and (e) identifying any of the plurality of devices corresponding to a measurement plotted outside the range of intrinsic variation as defective.

An important feature of the present invention is that a quiescent current defect may be detected by comparing quiescent current measured at a relatively low supply voltage with quiescent current measured at a relatively high supply voltage. The low supply voltage is preferably selected so that inherent variations in quiescent current measurements representative of defect free die include values of quiescent current measurements that are representative of defective die. Accordingly, the low supply voltage is preferably the lowest possible supply voltage required to maintain the current logic state. For a static CMOS process, the supply voltage may be reduced, for example, to the sub-threshold voltage region. The high supply voltage is preferably selected so that quiescent current measurements that are representative of defective die lie outside the inherent variations in quiescent current measurements representative of defect free die. The high supply voltage may be, for example, a voltage in the range between the nominal supply voltage and the absolute maximum supply voltage specified for the device under test.

FIG. 1 illustrates a scatter plot 100 of quiescent current measurements according to an embodiment of the present invention. Shown in FIG. 1 are a range of intrinsic variation 102 and measurement values 104.

Each of the measurement values 104 corresponds to one device in a group or lot of devices under test. In this example, the devices under test are integrated circuit die, however, other types of devices having a quiescent current parameter may also be screened for defects to practice the present invention within the scope of the appended claims.

As may be seen from the measurements 104 plotted in the scatter plot 100, the variation in quiescent current for defect free die is predictable with respect to the low supply voltage measurement and the high supply voltage measurement. Because the variation in quiescent current for defect free die is predictable, the measurement values 104 corresponding to the defect free die may be enclosed within a pair of lines representing the range of intrinsic variation 102. The devices corresponding to the measurement values 104 that lie outside the range of variation 102 are designated as defective.

FIG. 2 illustrates a flow chart 200 of a method of plotting quiescent current for screening defects according to an embodiment of the present invention.

Step 202 is the entry point of the flow chart 200.

In step 204, a first voltage, for example, the nominal supply voltage specified for a die, is applied to the die according to well-known die testing techniques. The first supply voltage is defined herein as the high supply voltage.

In step 206, the die is subjected to a test pattern according to well-known techniques until a selected stop point is reached that results in an "off" state, that is, a state of low current consumption. A stop point results from holding a set of input signal values being applied to the die from the test pattern constant until measurements are performed on the die.

In step 208, the quiescent current of the die at the nominal supply voltage is measured and recorded.

In step 210, steps 206 and 208 are repeated for each selected stop point in the test pattern to achieve the desired fault coverage.

In step 212, the supply voltage is reduced from the first supply voltage to a second supply voltage. The reduction in supply voltage is performed while holding the last selected stop point unchanged in the test pattern. The second supply voltage is selected so that quiescent current of a defective die has a value that lies generally within the range of values of quiescent current measured for good die. The second supply voltage is defined herein as the low supply voltage.

In step 214, the quiescent current of the die is measured at the low supply voltage and recorded.

In step 216, each of the measurements recorded in step 208 is plotted as a function of the measurement recorded in step 214.

Step 216 is the exit point of the flow chart 200.

The method exemplified by the flow chart 200 may be used to plot quiescent current values for each die in, for example, a wafer lot. The range of intrinsic variation 102 exemplified in FIG. 1 may be determined from the resulting plot of quiescent current according to well-known statistical techniques. The measurement values 104 corresponding to die that lie outside the range of intrinsic variation 102 are designated as defective die.

For example, if the quiescent current measurements at the selected stop points for a die measured at the nominal supply voltage are 450, 485, 422 and 506 nanoamperes, and if the quiescent current measurement at the low supply voltage is 48 nanoamperes, then four data points would be plotted on the scatter plot at X-Y coordinates (48,450), (48,485), (48, 422) and (48,506). Another set of quiescent current measurements for another die may generate points on the scatter plot at (52,475), (52,490), (52,555) and (52,638), and so on. The area of the scatter plot containing the highest concentration of data points defines the range of intrinsic variation, and the data points lying outside the range of intrinsic variation are screened as defective die.

FIG. 3 illustrates a flow chart 300 of a method of screening defects according to an embodiment of the present invention.

Step 302 is the entry point of the flow chart 300.

In step 304, a plot of quiescent current measurements corresponding to the high supply voltage vs. quiescent current measurements corresponding to the low supply voltage is generated for each device, for example, in a wafer lot of integrated circuit die as described with reference to FIGS. 1 and 2. Other types of data representations corresponding to the high supply voltage vs. quiescent current measurements corresponding to the low supply voltage may be used to implement the plot of quiescent current besides that shown in FIG. 1 to practice the present invention within the scope of the appended claims. For example, the plot of quiescent current may be a set of X-Y coordinates defined in a table structure for use by a computer program.

In step 306, a range of intrinsic variation is determined from the plot of quiescent current generated in step 304 according to well-known statistical techniques.

In step 308, the devices corresponding to measurements plotted outside the range of intrinsic variation are identified as defective.

Step 310 is the exit point of the flow chart 300.

In another aspect of the present invention, a computer program product for plotting quiescent current to screen defective die includes a medium for embodying a computer program for input to a computer and a computer program embodied in the medium for causing the computer to perform steps of: (a) measuring a quiescent current at a first supply voltage for each of a plurality of devices; (b) measuring a quiescent current at a second supply voltage for each of the plurality of devices; (c) generating a plot of the quiescent current measured at the first supply voltage vs. the quiescent current measured at the second supply voltage for each of the plurality of devices; (d) determining a range of intrinsic variation of quiescent current in the plot; and (e) identifying any of the plurality of devices corresponding to a measurement plotted outside the range of intrinsic variation as defective.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

While the invention herein disclosed has been described by means of specific embodiments and applications thereof, numerous modifications and variations could be made thereto by those skilled in the art without departing from the scope of the invention set forth in the following claims.

What is claimed is:

1. A method of screening defects comprising steps of:
   (a) measuring a quiescent current at a first supply voltage for each of a plurality of devices;
   (b) measuring a quiescent current at a second supply voltage for each of the plurality of devices;

(c) generating a plot of the quiescent current measured at the first supply voltage vs. the quiescent current measured at the second supply voltage for each of the plurality of devices;

(d) determining a range of intrinsic variation of quiescent current in the plot; and (e) identifying any of the plurality of devices corresponding to a measurement plotted outside the range of intrinsic variation as defective.

2. The method of claim 1 wherein the second supply voltage has a value selected so that quiescent current of substantially all of the plurality of devices is within the range of intrinsic variation.

3. The method of claim 2 wherein the first supply voltage is a nominal supply voltage of the plurality of devices.

4. The method of claim 2 wherein the quiescent current is measured at the first supply voltage or the second supply voltage for multiple stop points in a test pattern.

5. The method of claim 1 wherein the first supply voltage is a nominal supply voltage of the plurality of devices.

6. The method of claim 1 wherein the second supply voltage has a value selected in a sub-threshold voltage region of the plurality of devices.

7. The method of claim 1 wherein the quiescent current is measured at the first supply voltage or the second supply voltage for multiple stop points in a test pattern.

8. The method of claim 1 wherein the quiescent current is measured at the second supply voltage for only one stop point in a test pattern.

9. A computer program product for screening defects comprising:

a medium for embodying a computer program for input to a computer; and a computer program embodied in the medium for causing the computer to perform steps of:

(a) measuring a quiescent current at a first supply voltage for each of a plurality of devices;

(b) measuring a quiescent current at a second supply voltage for each of the plurality of devices;

(c) generating a plot of the quiescent current measured at the first supply voltage vs. the quiescent current measured at the second supply voltage for each of the plurality of devices;

(d) determining a range of intrinsic variation of quiescent current in the plot; and (e) identifying any of the plurality of devices corresponding to a measurement plotted outside the range of intrinsic variation as defective.

10. The computer program product of claim 9 wherein the second supply voltage has a value selected so that quiescent current of substantially all of the plurality of devices is within the range of intrinsic variation.

11. The computer program product of claim 10 wherein the first supply voltage is a nominal supply voltage of the plurality of devices.

12. The computer program product of claim 10 wherein the quiescent current is measured at the first supply voltage or the second supply voltage for multiple stop points in a test pattern.

13. The computer program product of claim 9 wherein the first supply voltage is a nominal supply voltage of the plurality of devices.

14. The computer program product of claim 9 wherein the second supply voltage has a value selected in a sub-threshold voltage region of the plurality of devices.

15. The computer program product of claim 9 wherein the quiescent current is measured at the first supply voltage or the second supply voltage for multiple stop points in a test pattern.

16. The method of claim 1 wherein the quiescent current is measured at the second supply voltage for only one stop point in a test pattern.

\* \* \* \* \*